United States Patent
Poplack et al.

(10) Patent No.: US 10,536,553 B1
(45) Date of Patent: Jan. 14, 2020

(54) METHOD AND SYSTEM TO TRANSFER DATA BETWEEN COMPONENTS OF AN EMULATION SYSTEM

(71) Applicant: CADENCE DESIGN SYSTEMS, INC., San Jose, CA (US)

(72) Inventors: Mitchell G. Poplack, San Jose, CA (US); Sharon Mutchnik, San Jose, CA (US); Hitesh Gannu, San Jose, CA (US); Ramesh Mogili, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 321 days.

(21) Appl. No.: 14/846,460

(22) Filed: Sep. 4, 2015

(51) Int. Cl.
*G06F 13/00* (2006.01)
*H04L 29/08* (2006.01)

(52) U.S. Cl.
CPC .......... *H04L 67/2861* (2013.01); *H04L 67/16* (2013.01)

(58) Field of Classification Search
CPC .. H04L 67/2861; H04L 67/16; G06F 17/5027
USPC ........................................................ 709/202
See application file for complete search history.

(56) References Cited

U.S. PATENT DOCUMENTS

| | | | | |
|---|---|---|---|---|
| 6,151,375 A * | 11/2000 | Nakatsugawa | ........ | H04N 7/162 348/E5.009 |
| 6,229,805 B1 * | 5/2001 | Linton | ................ | H04Q 11/0414 370/358 |
| 7,100,133 B1 * | 8/2006 | Meiyappan | ......... | G06F 17/5022 716/102 |
| 7,725,304 B1 * | 5/2010 | Beausoleil | .......... | G06F 17/5027 703/23 |
| 8,400,179 B1 * | 3/2013 | Hulbert | ............ | G01R 31/31924 324/750.3 |
| 8,966,454 B1 * | 2/2015 | Michelsen | .......... | G06F 11/3466 709/223 |
| 9,846,587 B1 * | 12/2017 | Schumacher | ........... | G06F 9/455 |
| 2002/0071431 A1 * | 6/2002 | Kosaraju | ............. | G06F 13/4072 370/389 |
| 2008/0229917 A1 * | 9/2008 | Devalapalli | .......... | G10H 1/0066 84/645 |
| 2010/0235135 A1 * | 9/2010 | Conner | ............ | G01R 31/31919 702/119 |
| 2011/0128027 A1 * | 6/2011 | Watanabe | ...... | G01B 31/318511 324/756.01 |
| 2011/0274119 A1 * | 11/2011 | Golovchenko | ......... | H04L 25/14 370/465 |
| 2011/0283140 A1 * | 11/2011 | Stevens | .................... | H04L 43/50 714/27 |

(Continued)

*Primary Examiner* — Tonia L Dollinger
*Assistant Examiner* — Schquita Goodwin
(74) *Attorney, Agent, or Firm* — Eric L. Sophir; Dentons US LLP

(57) ABSTRACT

An emulation system comprises an outband traffic generating device comprising at least one field programmable gate array coupled to a host system. The outband traffic generating device is configured to transfer one or more bits via an outband channel to a register of an inband traffic generating device. The inband traffic generating device comprises at least one field programmable gate array coupled to a target system. The inband traffic generating device is configured to transfer the one or more bits via an inband channel to the outband traffic generating device.

18 Claims, 6 Drawing Sheets

(56) References Cited

U.S. PATENT DOCUMENTS

| | | | | |
|---|---|---|---|---|
| 2013/0035925 | A1* | 2/2013 | Chang | G06F 17/5027 |
| | | | | 703/28 |
| 2013/0055022 | A1* | 2/2013 | Chong | G06F 11/3656 |
| | | | | 714/28 |
| 2013/0311817 | A1* | 11/2013 | Kim | G06F 1/04 |
| | | | | 713/501 |
| 2013/0347010 | A1* | 12/2013 | Frick | G06F 9/547 |
| | | | | 719/330 |
| 2015/0242295 | A1* | 8/2015 | Nguyen | G06F 17/5027 |
| | | | | 703/28 |
| 2016/0132332 | A1* | 5/2016 | Glasner | G06F 9/30018 |
| | | | | 712/208 |

\* cited by examiner

US 10,536,553 B1

METHOD AND SYSTEM TO TRANSFER DATA BETWEEN COMPONENTS OF AN EMULATION SYSTEM

TECHNICAL FIELD

This application relates generally to emulation systems and, more specifically relates to methods and systems for faster transferring of data between a host system and a target system.

BACKGROUND

System on Chip (SoC) designs being developed today have millions and millions of gates. The complexity of the designs combined with the devices using the SoC designs in industrial products has made design verification an essential element in the semiconductor development cycle. Thus, prior to manufacture, the hardware designers frequently employ emulators to verify the functional behavior of the electronic devices and systems fabricated in accordance with their designs. One type of verification system for a hardware device under test (DUT) is a hardware emulation system that generally provides an effective way to increase verification productivity, speed up time-to-market, and deliver greater confidence in the final SoC product. It provides a processor-based emulation system, which is in communication with a workstation that sends data to and from the DUT. Such data can include digital test vectors or real signals from a logic system for which the DUT is intended.

Conventional hardware emulation system include coupling systems for coupling the hardware emulation system with a target system. The target system is the operating environment where the DUT, once manufactured, will be installed. The hardware emulation system is configured to couple with the target system via communication cable assemblies. The communication cable assemblies form a target interface system for coupling the hardware emulation system and the target system. The communication cable assemblies may include an emulator connector assembly and a target connector assembly that are coupled via a communication cable. The target connector assembly is a piece of hardware that is located away from the hardware emulation system and connected to the target system. The target connector assembly may include a connector assembly and a pod. The pod is an interface system of the target system.

Most of the devices in the hardware emulation system communicate to each other through a PCI bus because all the devices are located inside a rack of the hardware emulation system. However, the pod is not located in the rack of the hardware emulation system, and there is no PCI interface linked to the pod so the communication between the hardware emulation system and the pod occurs using other interfaces. The communication by the hardware emulation system to the pod may be performed through an Ethernet port. The Ethernet port communicates with a low powered processor inside the pod called a board manager. Also, the communication by the hardware emulation system to a field processor gate array (FPGA) in the pod to transfer runtime data may occur through a low-speed interface such as UART. The UART works sufficiently for transfer of regular run time data, but is insufficient for sending large amounts of data to the pod. When the pod has to be reprogrammed, a large amount of data has to be sent from the hardware emulation system to the pod. The data sent through the UART takes a significant amount of time to transfer.

Therefore, there is a need for methods and systems that addresses the above mentioned drawbacks of the conventional techniques employed for data transfer between the hardware emulation system and the target system, and is thereby able to achieve optimal performance for compiling time as well as runtime when a large amount of data has to be transferred between the hardware emulation system and the target system.

SUMMARY

Methods and systems disclosed herein attempt to address the above issues and may provide a number of other benefits as well. Methods and systems of an emulation system described herein can provide a data transfer technique to transfer data between a host system and a target system that solves the above mentioned drawbacks of the conventional techniques being employed to transfer the data between the host system and the target system. In an embodiment, the data is transferred between the host system and the target system via an inband channel and an outband channel. The inbound channel and outband channel can comprise an optical cable.

In one embodiment, an emulation system is configured to transfer machine readable binary data from a host system pre-configured to transfer the binary data to a target system via a first channel, the system comprising an outband traffic generating device coupled to the host system and comprising at least one field programmable gate array transferring one or more bits via an outband channel to a register of an inband traffic generating device; and the inband traffic generating device coupled to the target system and comprising at least one field programmable gate array configured to transfer one or more bits via an inband channel to the outband traffic generating device.

In another embodiment, a processor-implemented method for transferring machine readable binary data from a host system that is pre-configured to transmit binary data to a target system via a first channel, the method comprising: establishing, by an outband traffic generating device coupled to the host system, communications between a field programmable gate array of the outband traffic generating device and a field programmable gate array of an inband traffic generating device coupled to the target system; transmitting, by the field programmable gate array of the outband traffic generating device, via an outband channel independent of the first channel one or more binary data bits to a register of an inband traffic generating device; and receiving, by the outband traffic generating device, via an inband channel independent of the first channel one or more binary data bits from the field programmable gate array of the inband traffic generating device.

It is to be understood that both the foregoing general description and the following detailed description are exemplary and explanatory and are intended to provide further explanation of the invention as claimed.

BRIEF DESCRIPTION OF THE DRAWINGS

The accompanying drawings constitute a part of this specification and illustrate an embodiment of the invention and together with the specification, explain the invention.

DETAILED DESCRIPTION

Figure 1:
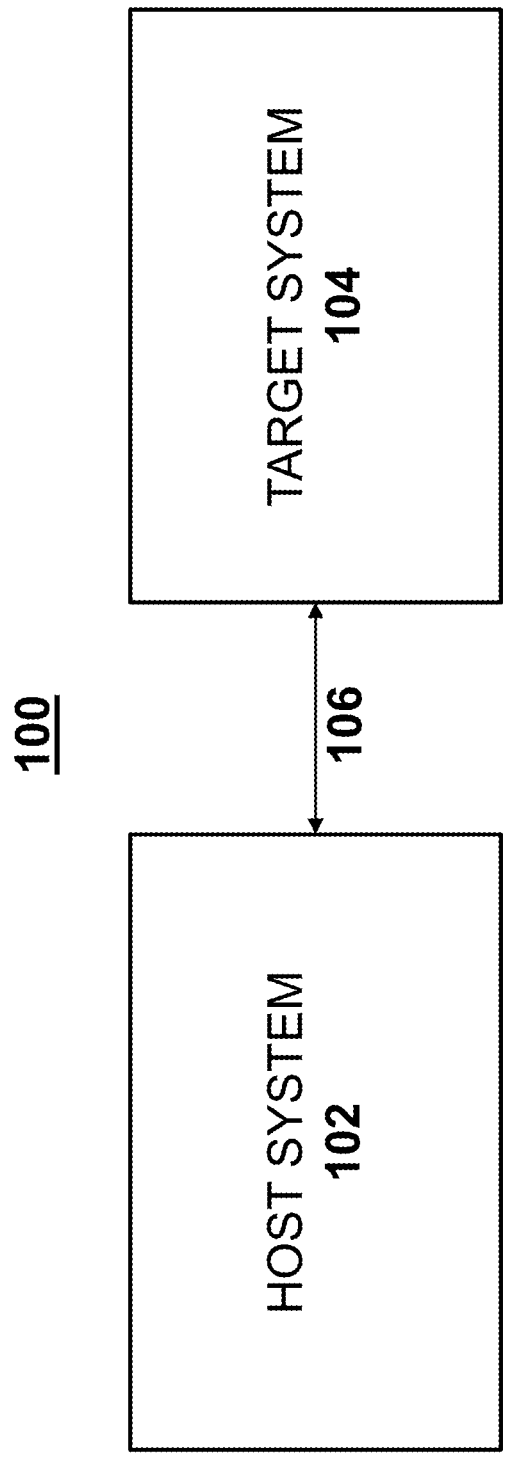
FIG. 1 is a block diagram of an emulation system environment, according to an exemplary embodiment.

The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here. Alterations and further modifications of the inventive features illustrated herein, and additional applications of the principles of the inventions as illustrated herein, which would occur to one skilled in the relevant art and having possession of this disclosure, are to be considered within the scope of the invention.

FIG. 1 is a block diagram of an emulation system environment 100, according to an exemplary embodiment. The emulation system environment 100 may include a host system 102 and a target system 104. The emulation environment system 100 may further include interface systems for coupling the host system 102 with the target system 104. In one embodiment, the host system 102 and the target system 104 may be coupled via a communication link 106, such as one or more communication cable assemblies, whereby communication signals can be exchanged among the host system 102 and the target system 104.

The target system 104 is an operating environment where a device under test (DUT), once manufactured, will be installed. In an embodiment, the target system 104 for a microprocessor DUT may be a personal computer. The host system 102 comprises a hardware emulator that is a programmable device used in the verification of a hardware design. The hardware emulator is configured to develop the target system 104 and/or one or more components of the target system 104. Prior to manufacture of an integrated circuit, designers generally verify the functionality of their designs. The hardware emulator allows designers to verify that the DUT will function in the target system 104, which logically represents a commercialized computing system in which the logic system (e.g., integrated circuit) being tested may eventually reside. The exemplary hardware emulation systems include the Palladium acceleration/emulation system produced by Cadence Design Systems, Inc., of San Jose, Calif.

Generally, a hardware emulator may comprise a computer for providing emulation support facilities, such as emulation software, a compiler, and a graphical user interface to allow a person to program the hardware emulator. In an embodiment, the compiler may be a software module, which may be executed by the hardware emulator, and is configured to receive and compile a netlist design file containing the logical gate design of an integrated circuit (IC), and then to generate a virtual logic file based on the compiled netlist. The compiler maps the IC's logic and timing of operations into the hardware components of the hardware emulator to generate instructions for the components of the hardware emulator to cause the hardware emulator to function as the IC would function. In an embodiment, the emulation software may be a software module, which may be executed by the hardware emulator, and is configured to track the status and control the performance of components of the hardware emulator. The emulation software may determine which components of the hardware emulator are available or unavailable to receive parts of the virtual logic generated by the compiler.

The hardware emulator system may further include racks, board clusters, logic boards, emulation chips, and buses of various types carrying data signals between the various components of the hardware emulator. The rack may be any physical housing for components of the hardware emulator. The rack houses a plurality of emulation logic boards that are organized into board clusters. In some cases, the rack may be a computing device, such as a server computer or workstation computer, configured to implement various emulation functions. The rack may physically house components of any type, such as board clusters, emulation logic boards, emulation chips, and buses hosting data signal communications.

The board clusters may be logical and/or physical collectives of one or more emulation logic boards. The logic boards may be clustered for any number of reasons, such as creating proximity among a set of boards for more efficient signal transfer and processing between the boards of the cluster. It should be appreciated that clustering logic boards is often a design consideration, and, as such, other embodiments may cluster and/or disaggregate logic boards according to any number of different organizational patterns. The board clusters may be interconnected with one another by buses that may carry data signals transmitted to and from the board clusters. The buses may interconnect the logic boards of a particular board cluster, so that the logic boards may transmit and receive data signals to and from other logic boards within the same board cluster.

The emulation logic boards comprise computing hardware components capable of emulation functionality to emulate the design and functions of an ASIC or other circuitry; non-limiting examples of emulated logic systems might include application-specific integrated circuits (ASICs), central processing units (CPUs), graphics processing units (GPUs), and arithmetic processing units (ALUs), among others. The logic board may comprise one or more emulation chips performing the functions needed for emulation, and one or more buses interconnecting the emulation chips. The buses may be an optical, copper, or any other conductive material capable of carrying data signals. In operation, the buses may carry data signals transmitted to and from the emulation chips of the logic board. In some cases, the logic board may comprise one or more buses supporting communication between emulation chips on the same logic board, and in some cases, the logic board may comprise one or more buses supporting communication between emulation chips located on other logic boards of the system.

The emulation chips may comprise any number of processors capable of performing the various tasks and processes for emulating an ASIC or other logical processing circuitry, multiplexers configured to direct data signals to and from the processors, buses for communicating data between the processors, and data lanes connecting the components of a processor. The processor includes suitable logic, circuitry, and interfaces that are operable to execute one or more instructions to perform predetermined operations/tasks. The processor can be realized through a number of processor technologies known in the art. The examples of the processor include, but are not limited to, an x86 processor, an ARM processor, a Reduced Instruction Set Computing (RISC) processor, an Application-Specific Integrated Circuit (ASIC) processor, or a Complex Instruction Set Computing (CISC) processor.

The emulator chip may be designed to mimic the functionality of any ASIC or other logic system design, based on programmable logic that configures the emulator chip's behavior to mimic the particular ASIC. In this way, circuitry designers may prototype new ASIC designs using processor-based emulation, before actually manufacturing the ASIC and emulation device. The emulation chips may receive a set of instructions to execute from the compiler.

The hardware emulator may include a memory that stores a set of instructions, the logic design, tasks, and the data. Some of the commonly known memory implementations include, but are not limited to, a random access memory (RAM), a read only memory (ROM), a hard disk drive (HDD), a secure digital (SD) card, a magneto-resistive read/write memory, an optical read/write memory, a cache memory, or a magnetic read/write memory. Further, the memory includes the one or more instructions that are executable by the processor to perform specific operations. It is apparent to a person having ordinary skills in the art that the one or more instructions stored in the memory enable the hardware emulator to perform the predetermined operations/tasks.

The hardware emulator may further include an instructional database (not shown) and a resource index database (not shown). The instruction database may store records of virtual logic or instruction sets compiled by the compiler from netlist files. The instruction database may be hosted in non-transitory machine-readable storage medium of any computing device capable of hosting the instruction database and performing the various tasks and processes associated with the instruction database, as described herein. The instruction database may receive, from a device executing the compiler, instructions compiled from the netlist file of an IC. In some cases, the instructions may be contained within a virtual logic file generated by the compiler. In an e embodiment, the resource index database may be a database or a machine-readable computer file (e.g., marked-out list) containing records for components of the hardware emulator. The resource index database or similar resource may be hosted in non-transitory machine-readable storage medium of any computing device capable of hosting the resource index database and performing the associated tasks and processes described herein. The records may indicate various types of status information about components, such as allocation status, availability status (e.g., busy, broken, incompatible), execution status (e.g., busy, idle), and the like. The resource index database may be periodically updated by modules of the hardware emulator.

Figure 2:
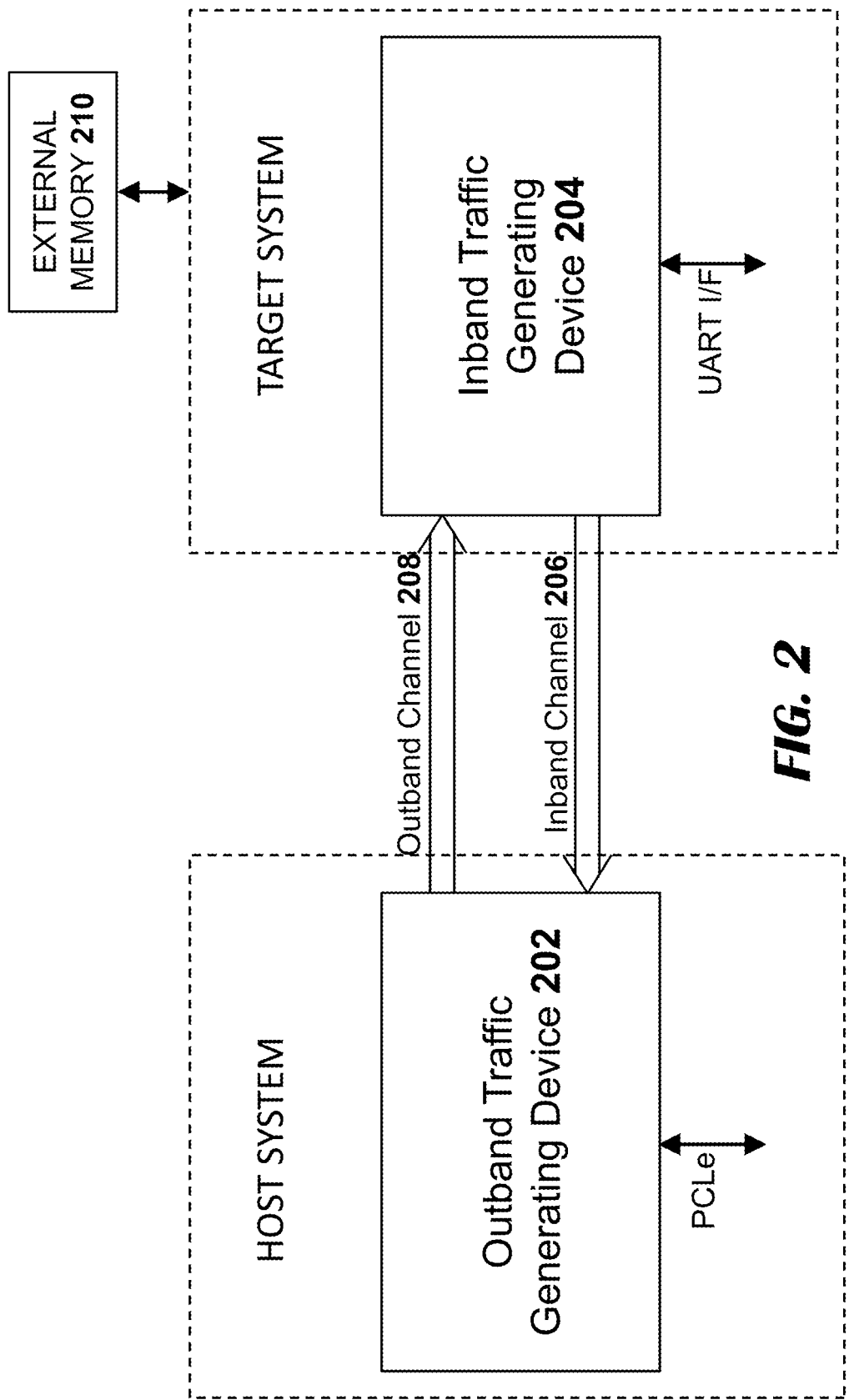
FIG. 2 is a block diagram depicting components of an emulation system, according to an exemplary embodiment.

FIG. 2 is a block diagram depicting components of an emulation system hosting data transfers between a host system and a target system, according to an exemplary embodiment. In one embodiment, an outband traffic generating device 202 may be coupled to the host system. In another embodiment, the outband traffic generating device 202 may be an integral component of the host system. The outband traffic generating device 202 is coupled to the host system such that one or more bits from the host system transfers via the outband traffic generating device 202. In other words, the outband traffic generating device 202 is a final physical location in the host system from where the one or more bits are moved outside of the host system. The outband traffic generating device 202 is coupled to a high speed interface bus, such as PCI bus. Alternative high speed interface buses may be utilized in other embodiments of the present disclosure without moving out from the scope of the disclosed embodiments. The outband traffic generating device 202 further include at least one field programmable gate array.

The outband traffic generating device 202 may be coupled to a buffer card assembly (not shown). In another embodiment, the buffer card assembly may be an integral component of the outband traffic generating device 202. The buffer card assembly provides an input/output system for the host system, and may be coupled with an emulation logic board of the host system via one or more high-speed communication cables and associated communications circuitry. The buffer card assembly may further include an interface buffer card for providing buffering to electrically protect the emulation modules of the emulation logic board from problematic external effects.

The target system may include a logic circuit and may be assembled along with one or more electronic components, such as integrated components and/or discrete components. The logic circuit may include reconfigurable logic circuits, such as one or more field-programmable gate arrays (FPGAs), and/or non-reconfigurable logic circuits, such as one or more application-specific integrated circuits (ASICs). In one embodiment, an inband traffic generating device 204 may be coupled to the target system. In another embodiment, the inband traffic generating device 204 is an integral component of the target system. The inband traffic generating device 204 comprises at least one field programmable gate array.

Each interface buffer card of the buffer card assembly may include a communication port for coupling the host system with the target system. The communication port may include a connector assembly having a plurality of contacts, pins, or terminals. Each communication port can have any appropriate number of terminals, where the number of terminals can be related to the number of communication signals to be supported by the communication port. The communication signals can thereby be exchanged among the host system with the target system.

The buffer card assembly of the host system is configured to couple with the target system via communication cable assemblies. The buffer card assembly and the communication cable assemblies can form a target interface system for coupling the host system and the target system. Any suitable type of communication cable assemblies can be used to couple the host system with the target system, however the communication cable assemblies preferably comprise at least one high density data cable. Each of the high density data cables can include an emulator connector assembly and a target connector assembly that are coupled via a communication cable. The target connector assembly may include a connector assembly and the inband traffic generating device 204.

The inband traffic generating device 204 may include analog and/or digital devices and is configured to perform one or more functions associated with the target interface system. The inband traffic generating device 204 is further coupled to a low speed interface bus, such as universal asynchronous/receiver transmitter circuit. Alternative low speed interface buses may be utilized in other embodiments of the present disclosure without moving out from the scope of the disclosed embodiments.

A communication channel connects the outband traffic generating device 202 and the inband traffic generating device 204. The communication channel is configured to execute the transfer of machine readable binary data between the outband traffic generating device 202 and the inband traffic generating device 204. The communication channel may include an inband channel 206 and an outband channel 208. The inband channel 206 is a functional input and the outband channel 208 is a function output of the inband traffic generating device 204. The outband channel 208 is configured to transfer the one or more bits binary data from the inband traffic generating device 204 to the outband traffic generating device 202, and the inband channel 206 is configured to receive write address, write data, and write commands from the outband traffic generating device 202.

In the illustrative embodiment, the inband channel 206 and the outband channel 208 are optical cables. In another embodiment, the inband channel 206 and the outband channel 208 may be any suitable serial bus that may comprise any material capable of transmitting machine readable binary data from the host system to destinations outside the host system that are not located on an emulation chip such as the target system, an external memory 210, or any other computing resource that is not housed on the emulation chip.

Figure 3:
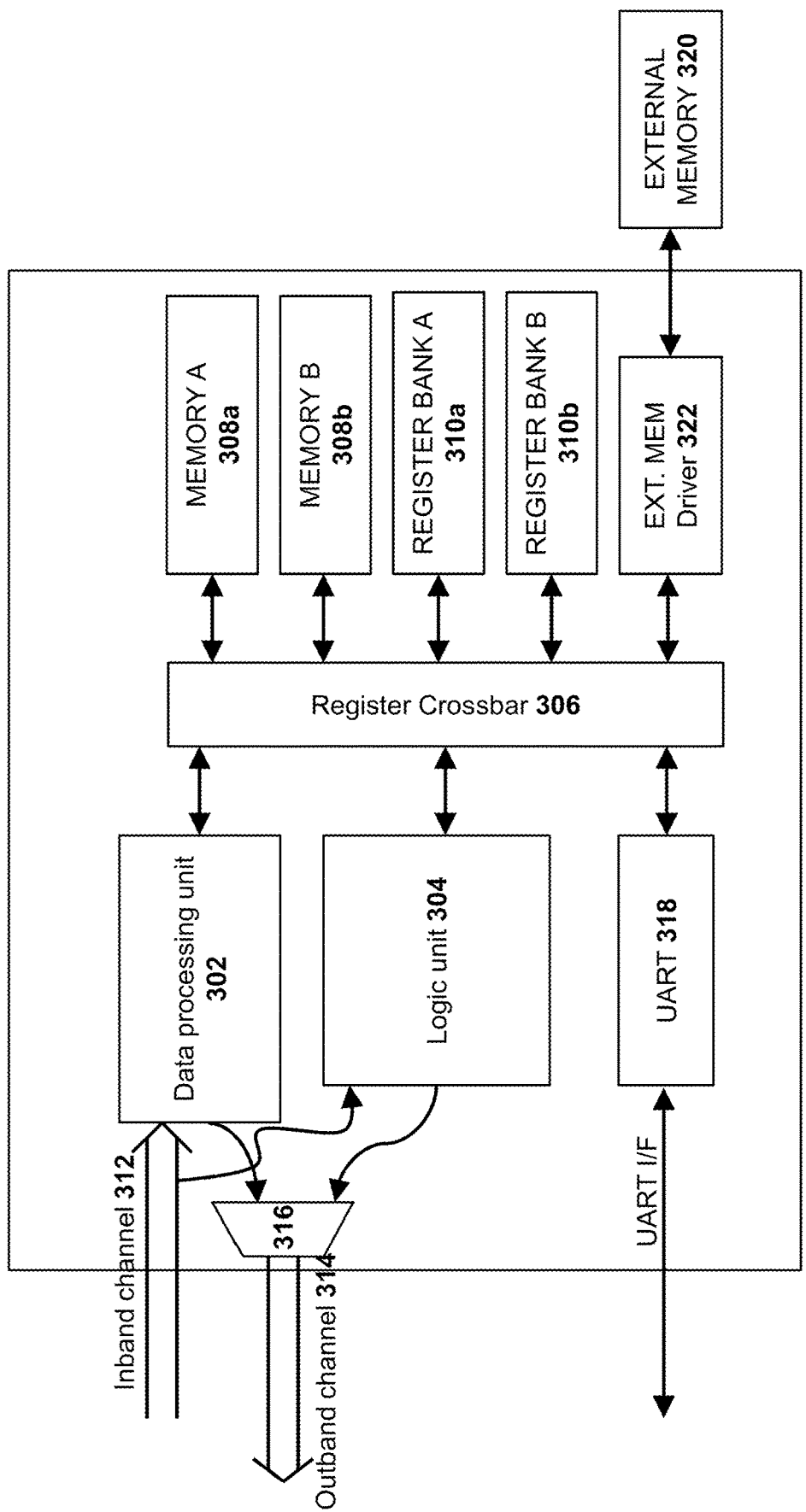
FIG. 3 is a block diagram of an inband traffic generating device of an emulation system, according to an exemplary embodiment.

FIG. 3 is a block diagram of an inband traffic generating device of an emulation system transmitting data between a host system and a target system, according to an exemplary embodiment. The inband traffic generating device may include a data processing unit 302, a logic unit 304, a register crossbar 306, memory units 308a and 308b, and register banks 310a and 310b.

The data processing unit 302 is configured to process one or more bits coming into the inband traffic generating device. The data processing unit 302 may include a processor to process the one or more bits. The processor includes suitable logic, circuitry, and interfaces that are operable to execute one or more instructions to perform predetermined operations/tasks. The processor can be realized through a number of processor technologies known in the art. The examples of the processor include, but are not limited to, an x86 processor, an ARM processor, a Reduced Instruction Set Computing (RISC) processor, an Application-Specific Integrated Circuit (ASIC) processor, or a Complex Instruction Set Computing (CISC) processor. The processor may include a Graphics Processing Unit (CPU) that executes the set of instructions to perform one or more processing operations on receiving the one or more bits. in the illustrative embodiment, the data processing unit 302 is configured to receive an inband traffic 312 which is a functional input of the inband traffic generating device, and perform encoding of the one or more bits received by the inband traffic generating device.

The data processing unit 302 may also include programmable or configurable logic, and configurable select and delays. In one embodiment, configurable devices of the data processing unit 302 may be programmed with machine-executable code that enables the configurable devices to perform the select, logic functions, and delays. In another embodiment, the data processing unit 302 is configured to use programmable MUXes, programmable function tables and delays, and is used to control certain operations of the inband traffic generating device. Such control may provide for synchronization, testing, debugging, running of the inband traffic generating device.

The logic unit 304 is configured to facilitate transmission of the one or more bits received by the inband traffic generating device to the register banks 310a and 310b of the inband traffic generating device. The logic unit 304 includes a piece of logic that controls the communication associated with the different components of the inband traffic generating device including, but not limited to, indicating to the inband traffic generating device when the inband traffic generating device needs to execute, indicating when the inband traffic generating device needs to stop working, and indicating the functions to be performed by the inband traffic generating device. In the illustrative embodiment, the logic unit 304 is configured to receive the one or more bits from an inband channel 312. The logic unit 304 is also configured to facilitate sending of machine readable binary data stored in the inband traffic generating device via an outband channel 314. The one or more bits received via the inband channel 312 includes write address, write data, and write commands from an outband traffic generating device. The machine readable binary data is sent via the outband channel 314 to the outband traffic generating device.

In some embodiments, the data processing unit 302 and the logic unit 304 are configured to send their inputs to a selector unit 316 that facilitates the transmission of the machine readable binary data from the inband traffic generating device to the outband traffic generating device.

A register crossbar 306 may include one or more circuit switches. It should be appreciated by one skilled in the art that the switches of the register crossbar 306 may be configured as a series of circuitry interconnects, which may be enabled or disabled such that the switches of the register crossbar 306 may select inputted data signals, perform logical functions on the selected data signals, and output data signals, when the data processing unit 302 of the inband traffic generating device enables or disables certain interconnects. An instruction set, stored in the memory units 308a, 308b, may provide instructions to the circuitry of the register crossbar 306. The register crossbar 306 is connected to the data processing unit 302 and the logic unit 304, and is configured to receive and send input/output signals to the data processing unit 302 and the logic unit 304.

The memory units 308a, 308b are configured to store instructions, data and/or a logic circuit that can include reconfigurable logic circuits, such as one or more field-programmable gate arrays (FPGAs), and/or non-reconfigurable logic circuits, such as one or more application-specific integrated circuits (ASICs). Some of the commonly known memory unit implementations include, but are not limited to, a random access memory (RAM), a read only memory (ROM), a hard disk drive (HDD), a secure digital (SD) card, a magneto-resistive read/write memory, an optical read/write memory, a cache memory, or a magnetic read/write memory. In the illustrative embodiment, two memory units, namely, memory A 308a and memory B 308b are shown. In alternate embodiments, a plurality of memory units may be utilized without moving out from the scope of disclosed embodiments. The inband traffic generating device further include register banks 308a, 308b that may be configured to store instructions, a storage address, or any kind of data (such as a bit sequence or individual characters). In the illustrative embodiment, two register banks, namely, register bank A 308a and register bank B 308b are shown. In alternate embodiments, a plurality of register banks may be utilized without moving out from the scope of disclosed embodiments. The memory units 308a, 308b, and register banks 308a, 308b may provide instructions/data to the circuitry of the register crossbar 306.

The inband traffic generating device may further include a universal asynchronous receiver/transmitters (UART) 318. The UART 318 is configured for serial communications. The UART 318 may include or connect a number of registers. The UART 318 may also be connected to at least one external input device, such as a keyboard or a mouse. The input received from the external input device may be stored in the number of registers. The inband traffic generating device may include a board manager that comprises a processor. The board manager is configured to monitor voltages of the components of the inband traffic generating device. The board manager is connected to the FGPA of the inband traffic generating device using the UART 318. In one example, the UART operates at 115 Kilohertz.

In the illustrative embodiment, the inband traffic generating device may be coupled with an external memory unit 320. The external memory unit 320 is connected to external memory drivers 322. The machine readable binary data stored in the inband traffic generating device may be transmitted to destinations outside the target system such as the hardware emulation system, the external memory 320, or any other computing resource that is housed on an emulation chip.

Figure 4:
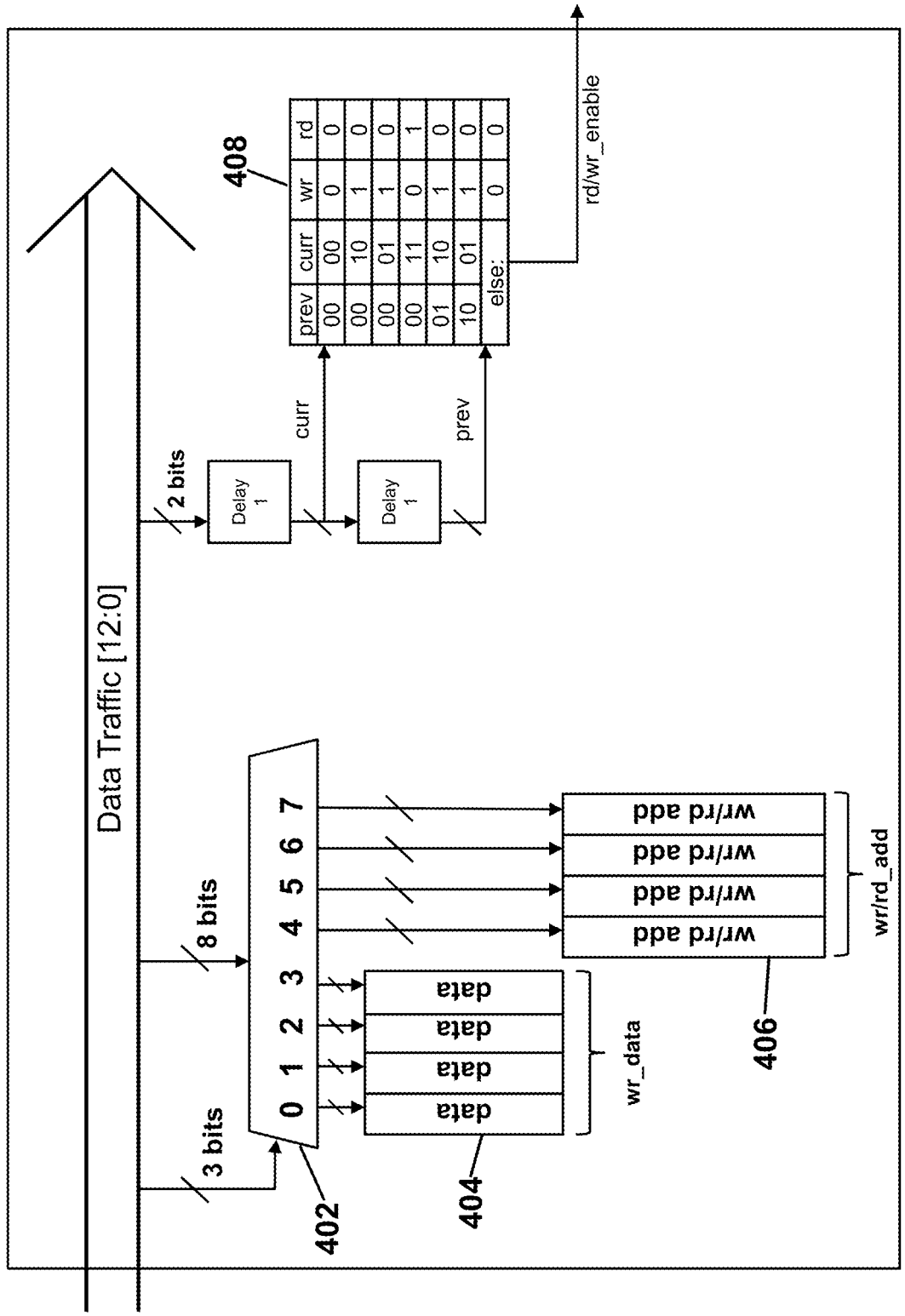
FIG. 4 is a block diagram depicting incoming data in an inband traffic generating device of an emulation system, according to an exemplary embodiment.

FIG. 4 is a block diagram depicting incoming data in an inband traffic generating device of an emulation system transmitting data between a host system and a target system, according to an exemplary embodiment. In the illustrated embodiment of FIG. 4, a logic unit of the inband traffic generating device is described.

The logic unit of the inband traffic generating device may include a selector logic. The selector logic is an inverted multiplexer 402. The inverted multiplexer 402 may be responsible for receiving one or more bits from a host system that is housed on an emulation chip, routing to destination registers on the inband traffic generating device coupled to the target system. The one or more bits arrive at the inverted multiplexer 402 through a communication channel (a serial bus), which may host data streams of serialized bits transmitted from the emulation chips or the emulation logic boards. The inverted multiplexer 402 may be based on an inverted multiplexer instruction set stored in an inverted multiplexer instruction memory, receive bits of a data stream from the communication channel, perform any number of logical operations on the bits of the data stream, generate a set of output bits, output parallel data signals containing the set of bits, and route the parallel data bits to specific registers on the inband traffic generating device. The inverted multiplexer 402 may execute its logical operations and routing functions based on the inverted multiplexer instruction set stored in the inverted multiplexer instruction memory. In alternate embodiments, the inverted multiplexer 402 may include a deserializer, which may be a function of the inverted multiplexer 402 or a multiplexer crossbar that is also a component of the inverted multiplexer 402. In such embodiments, the deserializer function or multiplexer may be responsible for outputting a set of bits of the one or more bits in the form of parallel data signals through parallel data lanes. That is, the deserializer function or feature of the inverted multiplexer 402 provides the inverted multiplexer 402 the capability to receive a data stream of serialized bits and then output parallel data signals containing bits of data.

An output of the inverted multiplexer 402 is connected to two registers. In another embodiment, there may be less than or more than two registers without moving out from the scope of the disclosed embodiments. The two registers include a first register 404 and a second register 406. The first register 404 is configured as a write data register. The second register 406 is configured as a read/write data register. In another embodiment, there may only be a read data-only register and a write data-only register without moving out from the scope of the disclosed embodiments.

In the illustrated embodiment, 13 bits of machine readable binary data is received. In alternative embodiments, any number of bits of data may be received without moving out from the scope of the disclosed embodiments. The 13 bits of data comprises a portion of actual data, a portion of data indicating a destination address of the actual data, a portion of data may be utilized for encoding operation. The 13 bits of the machine readable binary data comprises 8 bits of actual data, and 3 bits of data indicating the destination address of the 8 bits of actual data. The 3 bits of data indicating the destination address of the 8 bits of actual data is provided as an input to the inverse multiplexer 402. The inverse multiplexer 402 select each bit of the actual data, and send each bit of the actual data to their corresponding addresses in the registers of the inband traffic generating device as its output. In the illustrative embodiment, the 4 bits of machine readable binary data are sent to the register 404 and another 4 bits of data are sent to the register 406.

In an embodiment, 2 bits of the 13 bits of machine readable binary data is utilized for detection of changes in a data registry 408. The data registry 408 includes a table. The table includes four columns. Each column indicate a current bit (curr), a previous bit (prey), a write (wr), and a read (rd). In one example rule, if the prey is 0, and the curr is 00, no read or write operation can happen. In another example rule, if the prey is 0, and the curr goes to 10, one write action may be initiated. This table explains the use of bits from the one or more bits to command a write operation and/or a read operation based on the prey and the curr values. In an embodiment, the data registry 408 may be updated on every read/write action performed.

In an embodiment, the bits of the machine readable binary data are written into a register of the outband traffic generating device by a PCI express bus. The PCI express bus is configured to do bursts of the bits of the machine readable binary data. On the burst of the bits of the machine readable binary data by the PCI express bus, each piece of the machine readable binary data goes into a next adjacent address. In other words, on bursting a block of the machine readable binary data, each of the pieces of the machine readable binary data that's in the block of the machine readable binary data go to the adjacent addresses. For example, if there is a block of data that may be, say, a kilobyte wide, then the PCI express bus will send out some bits of data to each of the incrementing address. In the present disclosure, a register inside the outband traffic generating device is being written again and again by the bits of the machine readable binary data received from the outband traffic generating device. In other words, a number of different PCI transactions are performed to write the bits of the machine readable binary data into the same register. Thus, there is an optimization of the PCI express bus performed in order to obtain a number of addresses of the same register. This allows the PCI express bus to write a sequence of address, and since all the address are mapped to the same register, all the bits of the machine readable binary data ends up into the same register of the outband traffic generating device.

Figure 5:
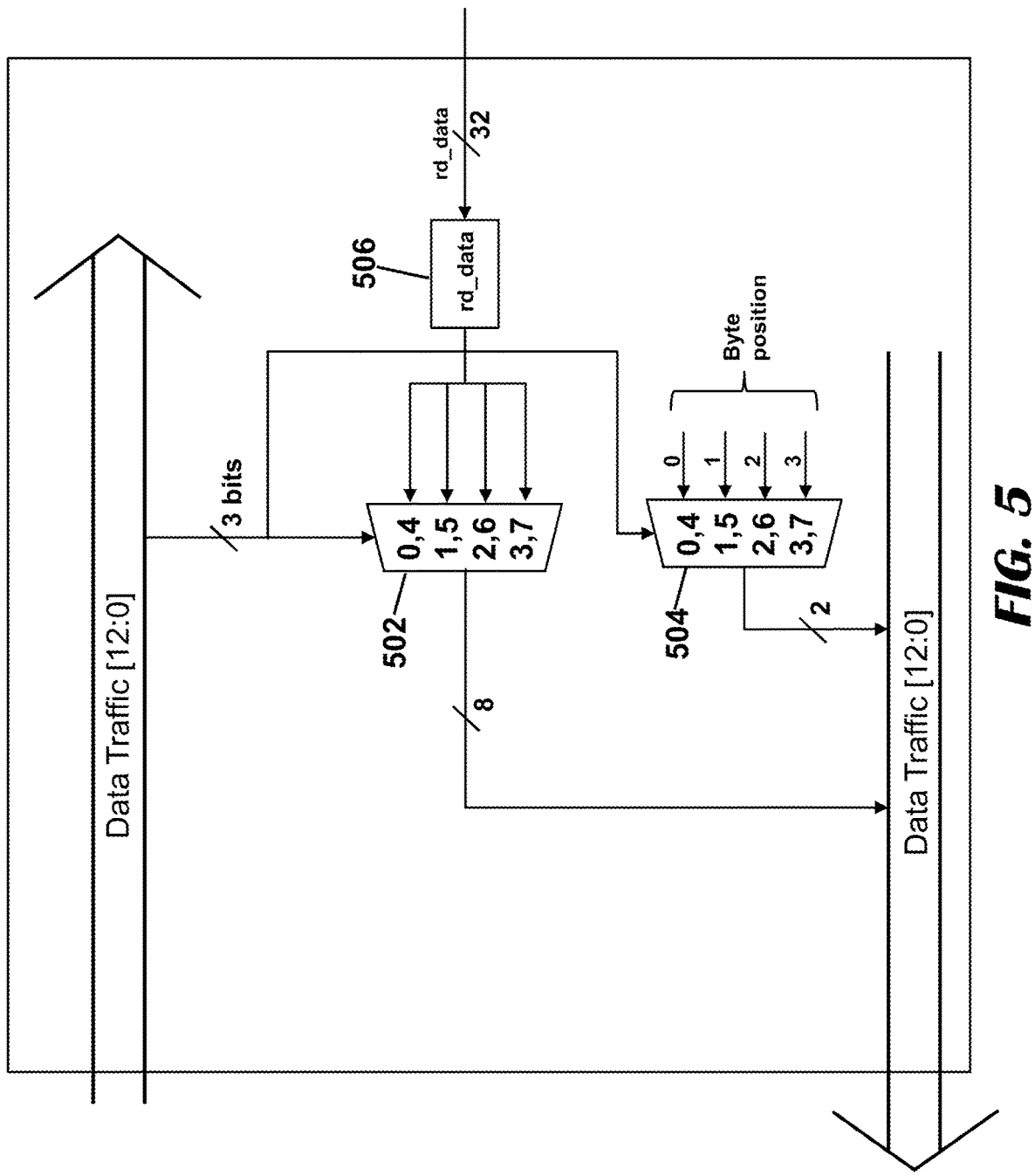
FIG. 5 is a block diagram depicting outgoing data from an inband traffic generating device of an emulation system, according to an exemplary embodiment.

FIG. 5 is a block diagram depicting outgoing data from an inband traffic generating device of an interface for executing transfer of data between a host system and a target system, according to an exemplary embodiment. FIG. 5 depicts a reverse of the process explained in FIG. 4. The logic unit of the inband traffic generating device may include a selector logic unit. The selector logic unit comprises a plurality of multiplexers, namely, 502 and 504. The multiplexer 502 may be responsible for receiving machine readable binary data from a register 506 that is housed on the inband traffic generating device, routing to destination register on an outband traffic generating device of a host system. A multiplexer instruction set is stored in a multiplexer instruction memory, and may provide instructions to the circuitry of a multiplexer crossbar. For example, a multiplexer crossbar may receive multiple bits of the machine readable binary data from the register 506 through parallel data lanes. The multiplexer 502 may select the input data bits of the machine readable binary data, as dictated by the instructions of the instruction set, and then route a set of outputs bits to an inband channel.

In the illustrated embodiment, 13 bits of the machine readable binary data is being sent from the inband traffic generating device to the outband traffic generating device. In alternative embodiments, any number of bits of machine readable binary data may be sent without moving out from the scope of the disclosed embodiments. The 13 bits of the machine readable binary data comprises a portion of actual data, a portion of data indicating a destination address of the actual data, a portion of data may be utilized for encoding operation. The 13 bits of the machine readable binary data comprises 8 bits of actual data, and 3 bits of data indicating the destination address of the 8 bits of actual data. The 3 bits of data indicating the destination address of the 8 bits of actual data is provided as an input to the multiplexer 504.

Figure 6:
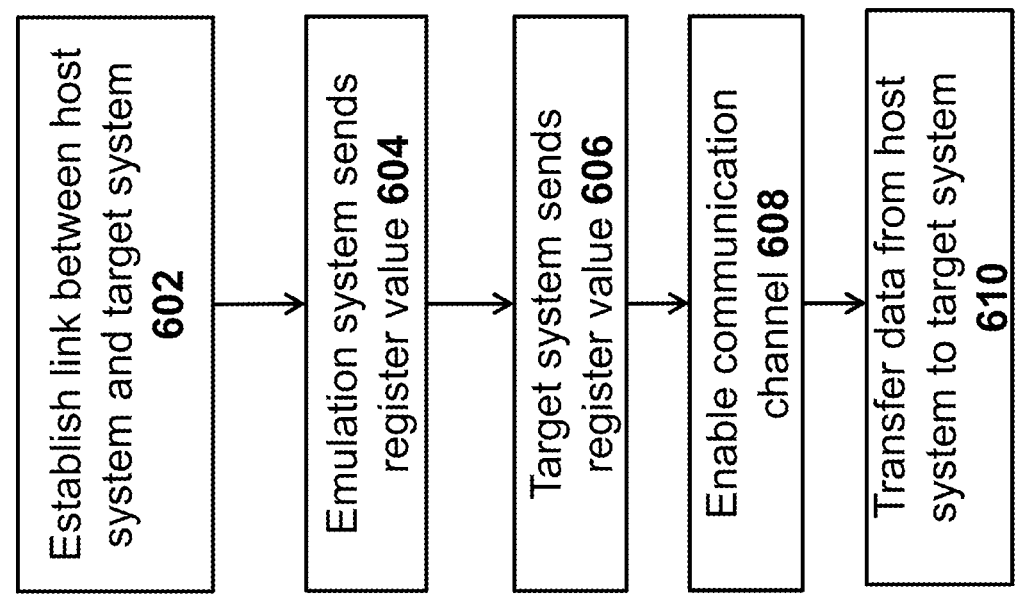
FIG. 6 is a flow diagram depicting a method of transfer of data between a host system and a target system, according to an exemplary embodiment.

FIG. 6 is a flow diagram depicting a method of transfer of data between a host system and a target system, according to an exemplary embodiment. This processor-implemented method executes a transfer of one or more bits of machine readable binary data between the host system and the target system is described. At step 602, establish a link between an outband traffic generating device coupled to the host system and an inband traffic generating device coupled to the target system. Each of the outband traffic generating device and the inband traffic generating device includes at least one field programmable gate array. In one embodiment, a communication channel is established that links the outband traffic generating device and the inband traffic generating device. The communication channel includes an outband channel and an inband channel.

At step 604, the outband traffic generating device sends its register values to the inband traffic generating device. At step 606, the inband traffic generating device sends its register values to the outband traffic generating device. At step 608, the communication channel between the outband traffic generating device and the inband traffic generating device is enabled. The communication channel is an optical cable configured to send register values of a register of the outband traffic generating device and a register of the inband traffic generating device to each other. In an embodiment, the communication channel includes the outband channel and the inband channel where the outland channel is a functional input of the inband traffic generating device and the inband channel is a functional output of the inband traffic generating device.

At step 610, transfer of the bits of the machine readable binary data between the outband traffic generating device and the inband traffic occurs. The outband traffic generating device is configured to transfer one or more bits via the outband channel to the register of the inband traffic generating device; and the inband traffic generating device is configured to transfer the one or more bits via the inband channel to the outband traffic generating device. In an embodiment, the inband channel is configured to receive write address, write machine readable binary data, and write commands from the outband traffic generating device.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, etc. When a process corresponds to a function, its termination may correspond to a return of the function to the calling function or the main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A processor-implemented method comprising:
   establishing, by an outband traffic generating device coupled to a hardware emulator of a host system, communications between a field programmable gate array of the outband traffic generating device and a field programmable gate array of an inband traffic generating device coupled to a target system;
   transmitting, by the field programmable gate array of the outband traffic generating device, via an outband channel one or more binary data bits to one or more registers of an inband traffic generating device, wherein the inband traffic generating device comprises a multiplexer configured to transmit the one or more binary data bits in the serial form received from the outband traffic generating device to the one or more registers in form of parallel data signals, wherein the multiplexer is further configured to select the one or more registers utilizing one or more destination address bits of the one or more binary data bits through one or more parallel data lanes, and wherein the inband traffic generating device further comprises a data registry configured to control read and write operations of the target system based upon data registry bits of the one or more binary data bits in the serial form; and
   receiving, by the outband traffic generating device, via an inband channel one or more binary data bits from the field programmable gate array of the inband traffic generating device.

2. The processor-implemented method of claim 1, wherein the outband channel comprises one or more optical communications circuits.

3. The processor-implemented method of claim 1, wherein the inband channel comprises one or more optical communications circuits.

4. The processor-implemented method of claim 1, further comprising transmitting, by the outband traffic generating device, to the inband traffic generating device via the outband channel a write address for the register memory of the inband traffic generating device, the binary data bits, and a write command instructing the inband traffic generating device to store the binary data bits to the address of the register.

5. The processor-implemented method of claim 1, wherein the one or more data bits transferred from the host system comprises a set of the one or more destination address bits representing a destination address in the register of the inband traffic generating device and a second set of bits representing output data produced by the host system coupled to the outband traffic generating device.

6. The processor-implemented method of claim 1, wherein the outband traffic generating device is coupled to PCI express bus.

7. The processor-implemented method of claim 1, wherein the inband traffic generating device comprises a logic unit configured to receive the one or more binary data bits from the outband traffic generating device and transmit the one or more bits into the register.

8. The processor-implemented method of claim 1, wherein the inband traffic generating device is coupled to an external memory device, and wherein the inband traffic generating device is configured to transfer the one or more bits received from the outband traffic generating device to the external memory device.

9. An emulation system comprising:
   a host system comprising a hardware emulator configured to verify operation of a circuit design;
   an outband traffic generating device coupled to the hardware emulator of the host system and comprising at least one field programmable gate array transferring one or more bits in a serial form via an outband channel to one or more registers of an inband traffic generating device, wherein the inband traffic generating device comprises a multiplexer configured to transmit the one or more bits in the serial form received from the outband traffic generating device to the one or more registers in form of parallel data signals, wherein the multiplexer is further configured to select the one or more registers utilizing one or more destination address bits of the one or more bits in the serial form through one or more parallel data lanes; and
   the inband traffic generating device coupled to a target system and comprising at least one field programmable gate array configured to transfer one or more bits received from the target system via an inband channel to the outband traffic generating device, wherein the target system is configured to contain the verified circuit design, the inband traffic generating device further comprising a data registry configured to control read and write operations of the target system based upon data registry bits of the one or more bits in the serial form.

10. The system of claim 9, wherein the outband channel comprises one or more optical communications circuits.

11. The system of claim 9, wherein the inband channel comprises one or more optical communications circuits.

12. The system of claim 9, wherein the inband channel traffic generating device is further configured to:

receive from the outband traffic generating device a write address, machine readable binary data representing data outputs, and a write command; and write the data outputs to the write address in the register upon receiving the write command.

13. The system of claim 9, wherein the one or more bits transferred from the host system comprises the one or more destination address bits representing destination address in the register of the inband traffic generating device and actual data transferred from the outband traffic generating device to the register of the inband traffic generating device.

14. The system of claim 9, wherein the outband traffic generating device is coupled to PCI express bus.

15. The system of claim 9, wherein the transfer of the machine readable binary data comprises reading or writing of the machine readable binary data.

16. The system of claim 9, wherein the inband traffic generating device is configured to transmit the one or more bits into the register based on a logic.

17. The system of claim 9, wherein the inband traffic generating device comprises a board manager including a processor configured to measure voltage of components of the inband traffic generating device.

18. The system of claim 9, wherein the inband traffic generating device is coupled to an external memory device, and wherein the inband traffic generating device is configured to transfer the one or more bits received from the outband traffic generating device to the external memory device.

* * * * *